United States Patent [19]

Nafziger

[11] Patent Number: 5,301,701
[45] Date of Patent: Apr. 12, 1994

[54] SINGLE-CHAMBER CLEANING, RINSING AND DRYING APPARATUS AND METHOD THEREFOR

[76] Inventor: Charles P. Nafziger, 2445 E. Encanto, Mesa, Ariz. 85213

[21] Appl. No.: 921,717

[22] Filed: Jul. 30, 1992

[51] Int. Cl.⁵ .............................................. D06B 3/04
[52] U.S. Cl. .................................. 134/95.2; 134/108; 134/111; 134/902
[58] Field of Search ...................... 134/95.1, 95.2, 105, 134/107, 108, 111, 200, 902

[56] References Cited

U.S. PATENT DOCUMENTS

| | | | |
|---|---|---|---|
| 3,727,620 | 4/1973 | Orr | 134/95.2 |
| 4,197,000 | 4/1980 | Blackwood | 134/95.2 X |
| 4,816,081 | 3/1989 | Mehta et al. | 134/902 X |
| 4,827,867 | 5/1989 | Takei et al. | 134/902 X |
| 4,917,123 | 4/1990 | McConnell et al. | 134/95.2 |
| 4,977,688 | 12/1990 | Roberson, Jr. et al. | 134/902 X |
| 5,039,349 | 8/1991 | Schoeppel | 134/95.1 X |
| 5,201,958 | 4/1993 | Breunsbach et al. | 134/902 X |

FOREIGN PATENT DOCUMENTS 2183552 6/1987 United Kingdom ................ 134/902

Primary Examiner—Philip R. Coe
Attorney, Agent, or Firm—Antonio R. Durando; Harry M. Weiss

[57] ABSTRACT

A machine that performs the steps of cleaning, rinsing and drying required prior to further processing in the course of conventional semiconductor fabrication in a single, hermetically and thermally insulated, process chamber. The machine consists of functionally compartmentalized sections connected to the process chamber for each specific function, comprising a cleaning-solution storage and circulation section, a rinsing fluid storage and circulation section, and a vacuum drying section. After enclosing the semiconductor product hermetically in the process chamber, a cleaning solution from an internal holding source is heated and circulated through it for the cleansing step, followed by purified water to rinse the cleaning fluid off the surface of the semiconductor material. A vacuum is then applied to completely remove any residue of rinsing water left on the wafers. Control options permit a user to adapt the wash-rinse-dry cycles to the specifications of the chemicals being used for the particular products being processed.

5 Claims, 3 Drawing Sheets

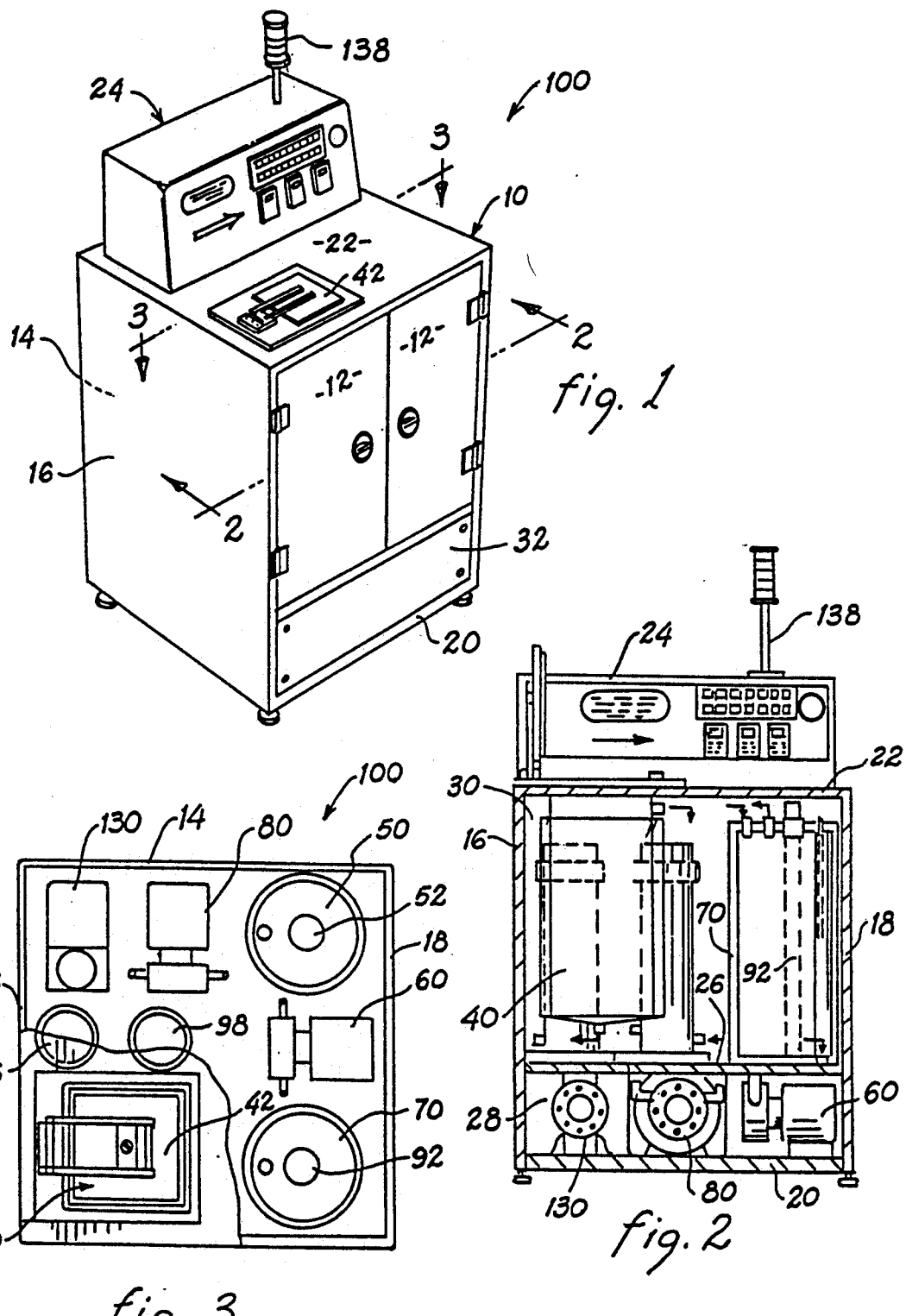

SINGLE-CHAMBER CLEANING, RINSING AND DRYING APPARATUS AND METHOD THEREFOR

BACKGROUND OF THE INVENTION

1. Field of the Invention

This invention pertains to the general field of equipment for cleaning wafers, finished semiconductors and related components in the electronic industry. In particular, it provides a new and improved machine that allows the steps of cleaning, rinsing and drying to be carried out in the same chamber within the apparatus of a single work station.

2. Description of the Prior Art

Wet processing in the semiconductor industry requires washing of the semiconductor components to either interrupt and neutralize the action of the etching agents or to remove other residues. This is typically carried out manually or automatically is several stages whereby unit carriers are exposed to a neutralizing-/washing chemical, rinsed and dried in different holding tanks. These stages require the units to be handled and moved from tank to tank, where each function is carried out. This procedure is costly because of the repeated manipulation of the product and because of the space requirements for housing and operating multiple-station equipment.

The neutralizing agents currently used consist of aqueous solutions of highly effective cleaning chemicals, such as the product sold by the Altos Group, Inc. of Glendale, Ariz., under the trademark "AQ-1534," which have replaced the toxic and environmentally undesirable chloro-fluoro-carbons originally used in the semiconductor industry. After rinsing with purified water, such as water produced by deionization or reverse osmosis, the semiconductors in the units need to be dried before proceeding to the next process phases of manufacturing. Typically, drying may be accomplished by blowing a heated inert gas or air into the container holding the wafers (air knife drying) to cause the vaporization of all water residue remaining on them. This process is expensive and inefficient because of the energy used to heat and blow the drying medium, and sometimes it is ineffective because of the difficulty of removing moisture from wet surfaces in contact with fixturing. In addition, the moisture removal is difficult to quantify and control to a constant level within acceptable product specifications.

Other drying processes rely on the hygroscopic properties of alcohols to extract moisture from the rinsed wafers. The semiconductor wafers are rinsed in alcohol and then dried, relying on the high volatility of the alcohol to obtain complete removal of the alcohol-water mixture. Because of the azeotropic properties of the alcohols normally used, though, complete water removal is hard to achieve. Moreover, the process is inherently dangerous because of alcohols' flammability and wasteful because used alcohol solutions must be discarded at significant environmental burden and production cost.

Therefore, there remains a need for a single-station piece of equipment that utilizes non-toxic aqueous cleaning solutions and purified water to clean and rinse semiconductor components, and that causes the material to dry inexpensively, effectively and efficiently, wherein all steps are carried out sequentially in a single compact machine. The present invention is directed at fulfilling all of these functions in the same machine by providing a cleaning system, a purified water rinsing system, and a vacuum drying system all connected to the same process chamber.

BRIEF SUMMARY OF THE INVENTION

Accordingly, one objective of this invention is the development of a machine that incorporates the functions of cleaning, rinsing and drying in a single process chamber.

Another goal of the invention is a machine that is compact and compatible with existing equipment, so that it may be easily incorporated into conventional semiconductor production lines.

Another objective is a versatile machine that permits a user to select among alternative cycles of operation designed to implement different specific processes using a variety of cleaning agents.

A further goal of the invention is a machine that is self-contained and capable of providing all of the required functions for a long time without the necessity of connection to any other apparatus, other than to utilities and to a source of cleaning and rinsing agents.

Finally, a further goal of the invention is the realization of the above mentioned goals in an economical and commercially viable manner, which is achieved by utilizing components that are either already available in the open market or that can be produced at competitive prices.

To the accomplishment of these and other objectives, this invention consists of a machine that performs the steps of cleaning, rinsing and drying required prior to further processing in the course of conventional semiconductor fabrication in a single, hermetically and thermally insulated, process chamber. The machine consists of functionally compartmentalized sections connected to the process chamber for each specific function, comprising a cleaning-solution storage and circulation section, a rinsing fluid storage and circulation section, and a vacuum drying section. After enclosing the semiconductors hermetically in the process chamber, a cleaning solution from an internal holding source is heated and circulated through it for the cleansing step, followed by purified water to rinse the cleaning fluid off the surface of the product material. A vacuum is then applied to completely remove any residue of rinsing water left on the wafers. Control options permit a user to adapt the wash-rinse-dry cycles to the specifications of the chemicals being used for the particular products being processed.

Various other purposes and advantages of this invention will become clear from its description in the specification that follows, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only one of the various ways in which the invention may be practiced.

BRIEF DESCRIPTION OF THE DRAWINGS

FIG. 1 is a perspective view of the preferred embodiment of a wash-rinse-dry machine according to the present invention.

FIG. 2 is a front cross-sectional view of the same machine as seen from line 2—2 in FIG. 1, showing the vertical position of the main components of the apparatus.

FIG. 3 is a top view of the machine shown in FIG. 1 as seen from line 3—3 in that figure, illustrating the horizontal position of the main components of the apparatus.

DETAILED DESCRIPTION OF THE INVENTION

Figure 4:
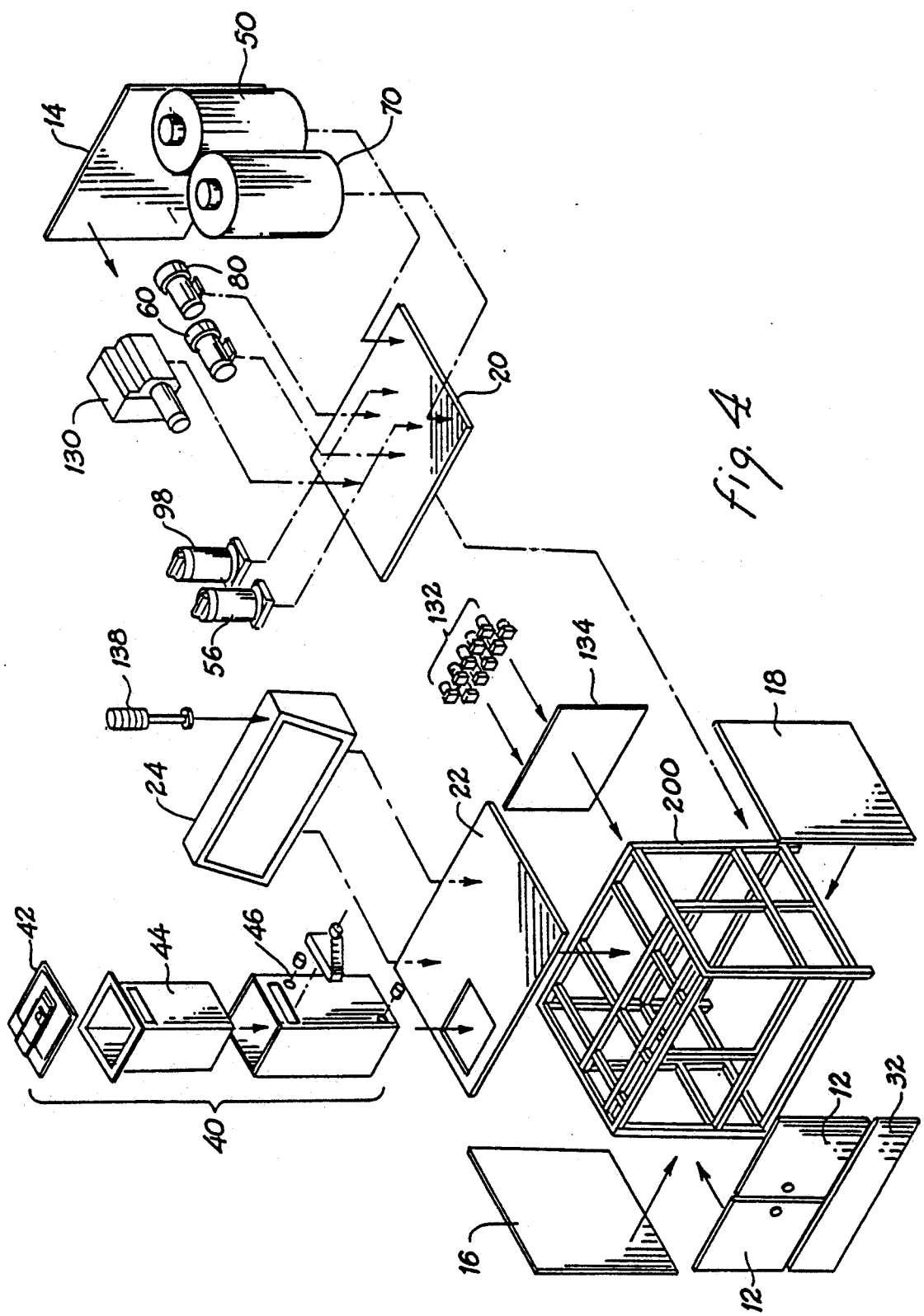
FIG. 4 is an exploded view of the machine of FIG. 1.

Part of this invention lies in the idea of combining the steps of cleaning, rinsing and drying semiconductor products in a single work station in the normal chain of semiconductor manufacturing steps. Another part is the idea of using vacuum drying to improve the removal of rinsing medium from the work-piece. This concept is reduced to practice in a novel combination of existing equipment and components to perform the desired functions within a self-contained and reliable apparatus.

Referring to FIGS. 1–4, the preferred embodiment of the wash-rinse-dry machine 100 of this invention is illustrated. The machine comprises a box-shaped housing or cabinet 10 that includes hinged front doors 12. The housing 10 consists of a rear wall 14, a left wall 16, a right wall 18, a bottom panel 20, and a top panel 22. Directly above the top panel 22, the machine comprises an additional enclosure 24 that is fixedly connected to the housing 10. As shown in FIG. 2, the left and right walls 16 and 18 are supported by attachment to the frame 200 (seen in FIG. 4). A cross member 26 separates the housing space into two areas, a relatively shallow bottom compartment 28 and a relatively high top compartment 30, so that various components of the machine may be anchored to the housing in the two compartments for connection with the appropriate piping and wiring. The rear wall 14, the bottom panel 20, the top panel 22, the left wall 16, and the right wall 18 are all removably connected to the frame 200, so that any panel can be removed for maintenance without affecting the integrity of the system. Similarly, the left and right walls 16 and 18 are removably connected at the tops thereof to the top panel 22 and at the bottoms thereof to the bottom panel 20. The two front doors 12 cover the top compartment 30 and are hinged to the left and right side of the frame 200. Finally, a bottom front panel 32 is also removably connected to the bottom and side panels to cover the bottom compartment 28.

The process chamber 40 of the invention consists of a jacketed container with a hinged, hermetic top lid 42 mounted horizontally on the top panel for processing semiconductor product trays enclosed therewithin under nearly isothermal and very low pressure conditions. FIG. 4 is an exploded view of the embodiment of the invention shown in FIGS. 1–3. As seen in that figure, the preferred embodiment of the process chamber 40 comprises an inner container 44 nested into an outer container 46, so that the space between the walls of the two containers provides a jacket 64 (seen in FIG. 5) for circulating constant-temperature water that makes it possible to control the operating temperature in the chamber. It is found that for a process chamber having a volume of approximately 2 cubic feet, a jacket 0.5 to 1.5 inch thick with constant-temperature water circulating at a rate of about 15 gpm is sufficient to control the operating temperature to within 2 degrees Fahrenheit. In a simpler embodiment of the invention, the jacket and circulating water system may be replaced with an unjacketed chamber wrapped in a thermally-controlled electrical heater, so that the chamber may be heated directly to the desired temperature. This type of system is less expensive to implement and, therefore, it may be preferable to the water heated jacket when temperature fluctuations requiring a large heat capacity are not expected.

Figure 5:
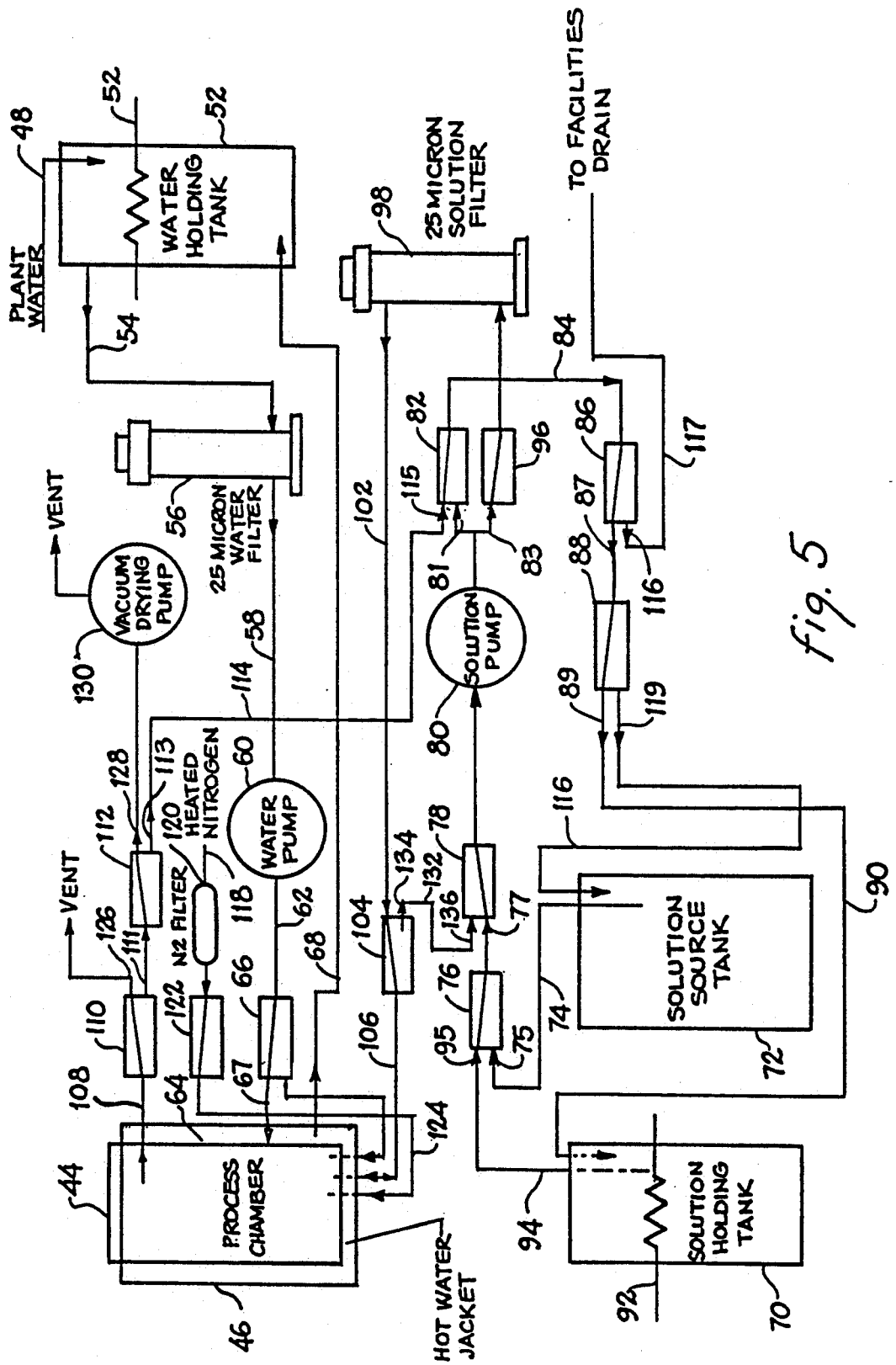
FIG. 5 is a schematic representation of the functional components and their hydraulic connections in the machine of FIG. 1.

As illustrated in schematic form in FIG. 5, the machine of the invention comprises a water supply system connected to a plant source through an inlet pipe 48 that feeds a heated water tank 50. Both for process and maintenance purposes, it is important that purified water be used, such as distilled or deionized water, or water treated by reverse-osmosis. The tank 50 is equipped with an electric heater 52 and a temperature controller (not shown in the figures) to heat the water contained in it to the correct temperature required for the particular process at hand. For most semiconductor cleaning applications, this temperature is in the 50° to 60° C. range. The tank 50 is sequentially connected through a tube or pipe 54 for flow in the direction indicated by the arrow in the line to a 25-micron filter unit 56 and, through a pipe 58, to a water pump 60. The filter of unit 56 can be any commercially available filter capable of stopping substantially all solid particles larger than 25 microns in diameter, such as the wound-carbon cartridge filter sold by the Ryan Herco Company of Burbank, Calif., under Part No. 6815-310. Obviously, other suitable filters may be used, depending on the particular process parameters followed. The filter housing is preferably fabricated with CPVC (chloride-polyvinylchloride) or equivalent material to withstand high temperatures. The pump 60 is preferably a seal-less pump magnetically coupled to an electric motor, having a housing of stainless steel with "Viton ®" or "Teflon ®" internal parts and capable of operating at high temperatures. For example, the seal-less magnetic-drive centrifugal pump sold by the Ryan Herco Company as Part No. 6305-500, rated at 17 gpm, has been successfully used to implement the invention. A pipe 62 connects the outlet of the pump unit 60 to the jacket 64 of the process chamber through the first outlet port 67 of a three-way valve 66. A return pipe 68 connects the jacket 64 to the water tank 50, so that the water can be continuously circulated through the jacket from the tank to maintain the temperature of the process chamber constant.

Still referring to the diagram of FIG. 5, a second heated tank 70 is provided for holding the cleansing solution used to clean the semiconductor product in the process chamber 44. The cleansing agent is initially stored in a source tank 72, which is preferably not contained within the machine of the invention but rather used to replenish it from time to time from the outside. A flexible outlet pipe 74 ties the source tank to the machine through the first inlet ports 75 and 77 of two three-way valves 76 and 78, respectively, and connects it to the input port of a solution pump 80, which is used to circulate the cleaning solution as required by the operation. The pump 80 feeds the solution holding tank 70 through the first port 81 of a three-way valve 82, which is in turn connected by a segment of pipe 84 to another three-way valve 86, whose first outlet port 87 is tied to a three-way valve 88 and, through its first outlet port 89 and the segment of pipe 90, to the holding tank 70. The solution in tank 70 is heated to the desired temperature by a temperature-controlled electric heater 92, so that it is available for use in preheated condition.

The outlet pipe 94 of the tank 70 is connected to the solution pump 80 by means of the second inlet port 95 of the three-way valve 76 and the first inlet port 77 of valve 78, so that the cleaning solution may be pumped into the second leg 83 of the pump's output pipe and through a two-way valve 96 for passing through a 25-micron solution filter 98. The output line 102 of the filter 98 is connected to the interior of the process chamber 44 through the first inlet port of a three-way valve 104 and an input line 106. An output line 108 at the top of the chamber permits the recirculation of the cleaning solution in the process chamber 44 by passing it through the first outlet ports 111 and 113 of two more three-way valves 110 and 112, respectively, and then through line 114, which is tied to the second inlet port 115 of the three-way valve 82, so that it is connected back to the loop of pipe 84 that leads to the holding tank 70, as detailed above. If necessary because of excessive contamination or any other reason, the contents of line 84 can be discharged to the facility's drain by switching the valve 86 to its second outlet port 116 for discharge through line 117. Similarly, valve 88 can be switched to its second outlet port 119 in order to route the cleaning solution back to the source tank 72 through line 116.

A separate set of piping and equipment is provided for the drying phase of the process. An inlet pipe 118 is connected to an outside source of heated nitrogen and, through a nitrogen filter 120 (a conventional air regulator filter such as Part No. 5Z415 sold by the W. W. Granger Company of Tempe, Ariz.), to a two-way valve 122 to control its flow into the process chamber through line 124 and a gas diffuser (not shown in the drawings) placed at the bottom of the process chamber 44. The nitrogen can be purged from the chamber by venting it either directly through the output line 108 and the valve 110 switched to its second outlet port 126 connected to a vent, or by vacuum suction, by passing the gas through the first outlet port 111 and switching valve 112 to its second outlet port 128, which is connected to the suction side of a vacuum pump 130, itself vented to the outside. Finally, a line 132 is provided between the second port 134 (used as an outlet) of valve 104 and the second inlet port 136 of valve 78 to connect the interior of the process chamber 44 to the suction side of pump 80 for ultimate drainage through line 117. Depending on the characteristics of the material being processed, air may be used instead of nitrogen throughout the processing operation.

FIG. 4 is an exploded view of the various components of the preferred embodiment of this invention implementing the schematic of FIG. 5 in a practical form of construction wherein all parts are easily accessible for assembly and repair, so as to produce the machine illustrated in FIG. 1 by attaching all components to a single support frame 200. All the valves (shown collectively as 132) are mounted on a single support panel 134 and the piping (not shown in FIG. 4) is routed between the various components according to the schematic of FIG. 5. Control circuitry and a control panel are provided, mounted in the enclosure 24 on top of the cabinet 10, for automatic cycling through the process steps required to clean, rinse and dry the semiconductor wafers contained in the process chamber 40. The electronic controls used to implement the operating cycles of the machine are based on conventional hardware available for automation of appliances such as dishwashers and washing machines. Therefore, they are not described here inasmuch as one skilled in the art could easily adapt conventional electronic hardware to accomplish the control functions required for any cycle of operation that may be desired as a matter of design choice.

In operation, when the machine of the invention is turned on for a cleaning cycle, circulation of preheated water through the jacket 64 of the process chamber is initiated to bring the unit to the desired cleaning temperature, normally in the 50° to 60° C. range for cleaning of semiconductor wafers. Alternatively, if the machine is equipped with an electric heater around the process chamber, the heater is activated to raise its temperature to operating conditions. The material requiring cleaning is loaded into the process chamber and the lid is locked into place. A preheated cleaning solution, such as AQ-1534, is pumped into the process chamber to completely flood the material and recirculated at a sufficiently high rate (approximately 7–8 gpm) to agitate it and improve mass transfer during the cleaning phase. A stream of nitrogen (or air) may be released through the liquid to further improve agitation. The normal operating temperature for semiconductor processing is 50° to 60° C. and the cleaning solution is preheated to that temperature in its holding tank. After a predetermined period of time has lapsed, typically five minutes for semiconductor processing, the chamber is emptied by returning the cleaning solution back to its holding tank and by backfilling the chamber with nitrogen. Preheated (to 50° to 60° C.) purified rinse water is then pumped into the chamber and again subjected to agitation by high rate circulation for a predetermined rinsing period (normally about 5 minutes). The chamber is then emptied and backfilled with nitrogen, and the rinse water is discarded to a drain. Alternatively, the rinse water could be returned to its holding tank for repeated use until a certain level of contamination has been reached (the piping for this option is not shown in the figures, but its implementation would be an obvious design choice for one skilled in the art). After this step, the drying phase is carried out by imposing a vacuum suction on the empty chamber that causes any residual particles of water to quickly vaporize. During this vaporization process, the temperature of the chamber and its contents tend to decrease because of the heat of vaporization extracted by the vaporizing water, resulting in possible ice formation before all water is removed. Therefore, a trickle flow of nitrogen is distributed through the chamber in order to provide a source of heat that prevents the formation of ice. It is found that the vacuum pump is able to maintain a relatively constant pressure of about 7–10 torr until all water has been removed, after which the pressure tends to decrease to below 4 torr, indicating that the drying process has been completed. At this point ambient pressure is allowed to be reestablished in the process chamber, so that it can be opened to remove the cleaned material. As illustrated in FIGS. 1, 2 and 4, an alarm 138 may be provided to alert a user of the termination of the automatic cleaning cycle.

Thus, the system features a pressure vessel that remains sealed during cleaning, rinsing and vacuum drying, so as to minimize handling and contamination. By circulating preheated water in the jacket around the vessel (or by the action of an electric heater), the process chamber is also preheated to the desired process temperature, minimizing heat losses and temperature variations during the cycle of operation. Mass transfer during the cleaning and rinsing stages of the operation are enhanced by the agitation of the liquid produced by the high circulation rate through the chamber and, if desired, also by diffusion of nitrogen or air through the chamber. Finally, the effectiveness of the drying phase is greatly improved over the prior art by the use of vacuum conditions. In addition, the machine of this invention eliminates the need for multiple stations that require multiple steps for moving and subjecting the material being cleaned to the various process phases. Instead, this machine provides a compact, single-station apparatus that performs the cleaning task in a more efficient and effective manner.

Although described in the context of semiconductor processing, the machine of the invention could obviously be used to clean any material of article of manufacture that requires contact with a cleaning solution, rinsing and drying as part of a process sequence. While any conventional means of construction is acceptable for the manufacture of the housing 10 of this machine, it is found that mild steel square tubing (preferably 1.5-inch in size) wire welded at all points of connection, together with side panels made with 18 gauge mild steel with a 0.5-inch bent-lip stiffener on all sides, provide suitable materials for manufacturing because of their structural strength, light weight and relatively low cost. Many obvious particulars of the machine are not described here because they do not represent inventive subject matter, but rather simple solutions to well understood accessory requirements of the invention. For example, the apparatus must be wired for connection with the control panel and to a power source, sturdy hinges are required to support the front doors, and a lock may be provided to secure their closure. Various changes in the details, steps and materials that have been described may be made by those skilled in the art within the principles and scope of the invention herein illustrated and defined in the appended claims. Therefore, while the present invention has been shown and described herein in what is believed to be the most practical and preferred embodiment, it is recognized that departures can be made therefrom within the scope of the invention, which is therefore not to be limited to the details disclosed herein but is to be accorded the full scope of the claims so as to embrace any and all equivalent apparatus and methods.

The embodiments of an invention in which an exclusive property right is claimed are defined as follows:

1. A machine for cleaning, rinsing and drying material in a single processing work station, comprising:
   (a) a housing;
   (b) a process chamber mounted on said housing and capable of being hermetically sealed;
   (c) means for controlling the temperature of said process chamber;
   (d) means for cleaning a material stored in said chamber with a cleansing solution and for draining the cleansing solution out of the chamber after the cleaning operation is completed;
   (e) means for rinsing the cleaned material in said chamber with purified water and for draining the water out of the chamber after the rinsing operation is completed;
   (f) means for drying the material in said chamber by applying a vacuum after the rinsing operation is completed;
   (g) means for controlling the functioning of all said means for cleaning, rinsing and drying in said process chamber; and
   (h) a gas delivery system for injecting a gas into said process chamber;
   wherein said gas delivery system consists of a source of heated nitrogen, a nitrogen filter, a vacuum pump, a plurality of nitrogen valves, and nitrogen piping to pass the heated nitrogen through the process chamber and then alternatively either directly to a vent or first through said vacuum pump and then to a vent.

2. The machine of claim 1, wherein said means for drying the material in said process chamber by applying a vacuum consists of a vacuum pump connected to the chamber and to a vent, whereby any liquid in the chamber may be vaporized and vented until the chamber is completely dry.

3. The machine of claim 1, wherein said means for cleaning the material stored in said chamber with a cleansing solution and for draining the solution out of the chamber after the cleaning operation is completed consists of a solution holding tank, a solution pump, a plurality of solution valves, and solution piping connecting said tank, pump and valves to circulate the cleansing solution from the solution holding tank to the process chamber and then alternatively back to the solution holding tank or to a drain.

4. The machine of claim 3, further comprising a 25-micron solution filter in the piping between said solution holding tank and said process chamber.

5. The machine of claim 4, further comprising a solution heater in said solution holding tank to raise the temperature of the solution to the operating temperature of said process chamber.

* * * * *